(12) United States Patent
Stan et al.

(10) Patent No.: US 7,732,705 B2
(45) Date of Patent: Jun. 8, 2010

(54) RELIABLE INTERCONNECTION OF SOLAR CELLS INCLUDING INTEGRAL BYPASS DIODE

(75) Inventors: Mark A. Stan, Albuquerque, NM (US); Marvin Bradford Clevenger, Albuquerque, NM (US); Paul R. Sharps, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 1275 days.

(21) Appl. No.: 11/247,828

(22) Filed: Oct. 11, 2005

(65) Prior Publication Data

US 2007/0079863 A1 Apr. 12, 2007

(51) Int. Cl.
*H01L 31/042* (2006.01)

(52) U.S. Cl. .................. 136/244; 136/243; 136/265; 257/461; 257/465; 257/431; 438/74; 438/66; 438/59

(58) Field of Classification Search ......... 136/243–265; 257/461, 465, 431; 438/74, 66, 59
See application file for complete search history.

(56) References Cited

U.S. PATENT DOCUMENTS

| | | | | |
|---|---|---|---|---|
| 5,616,185 | A * | 4/1997 | Kukulka | 136/244 |
| 6,600,100 | B2 * | 7/2003 | Ho et al. | 136/255 |
| 6,617,508 | B2 * | 9/2003 | Kilmer et al. | 136/252 |

* cited by examiner

*Primary Examiner*—Alexa D Neckel
*Assistant Examiner*—Xiuyu Tai

(57) ABSTRACT

A solar cell array including a first solar cell with an integral bypass diode and an adjacent second solar cell and two discrete metal interconnection members coupling the anode of the bypass diode of the first cell with the anode of the second solar cell.

20 Claims, 11 Drawing Sheets

RELIABLE INTERCONNECTION OF SOLAR CELLS INCLUDING INTEGRAL BYPASS DIODE

BACKGROUND OF THE INVENTION

1. Field of the Invention

The present invention relates to the field of solar cell semiconductor devices, and particularly to integrated semiconductor structures including a multifunction solar cell and a bypass diode.

2. Description of the Related Art

Photovoltaic cells, also called solar cells, are one of the most important new devices for producing electrical energy that has become commercially competitive with other energy sources over the past several years. Considerable effort has gone into increasing the solar conversion efficiency of solar cells. As a result, solar cells are currently being used in a number of commercial and consumer-oriented applications. While significant progress has been made in this area, the requirement for solar cells to meet the needs of more sophisticated applications has not kept pace with demand. Applications such as satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated from semiconductor wafers in vertical, multifunction structures, and the wafers or cells are laid out in a planar array, with the individual solar cells connected together in columns in a series electrical current. The shape and structure of the columns forming the array, as well as the number of cells it contains, are determined in part by the desired output voltage and current.

When solar cells in an array are all receiving sunlight, i.e. the top layer of the cell is illuminated, each cell in the array will be forward biased and will be carrying current. However, when the solar cell is not receiving sunlight, whether because of shading by a movement of the satellite or as a result of damage to the cell, then resistance exists along the cell path. As solar cells exist in an array, some cells may be generating current, and others may be inactive. In such case, the current from illuminated cells must still pass through the shaded cells. A current would force its way through the cell layers, reversing the bias of such cells and permanently degrading, if not destroying the electrical characteristics of such cells.

If the series electrical circuit contains a diode and certain solar cells are shaded, the current passing through the shaded cells can be offered an alternative, parallel path through the inactive cells, and the integrity of the shaded cells will be preserved. The purpose of the bypass diode is to draw the current away from the shadowed or damaged cell. The bypass diode become forward biased when the shadowed cell becomes reverse biased. Since the solar cell and the bypass diode are in parallel, rather than forcing current through the shadowed cell, the diode draws the current away from the shadowed cell and completes the electrical current to maintain the connection to the next cell.

If a cell is shaded or otherwise not receiving sunlight, in order for the current to choose the diode path, the turn on voltage for the diode path must be less than the breakdown voltage along the cell path. The breakdown voltage along the cell path will typically be at least five volts, if not more. In the case of a Schottky bypass diode, the Schottky contact requires a relatively small amount of voltage to "turn on", about 600 millivolts. However, to pass through the Ge junction the bias of the Ge junction must be reversed, requiring a large voltage. Reversing the bias of the Ge junction requires approximately 9.4 volts, so nearly ten volts are needed for the current to follow the diode path. Ten volts used to reverse the bias of the Ge junction is ten volts less than otherwise would be available for other applications.

U.S. Pat. No. 6,680,432 describes a multijunction solar cell with an integral bypass diode structure in which a metal shunt is used to "short" the Ge junction to the base of the bypass diode. Because of the short, a minimal voltage is required to pass current between the bypass diode and the Ge substrate. No longer is a high voltage required to force the current through the Ge junction. The current flows easily through the "short" path.

More particularly, the multijunction solar cell described in the above noted patent includes a substrate, a bottom cell, a middle cell, a top cell, a bypass diode, a lateral conduction layer, and a shunt. The lateral conduction layer is deposited over the top cell. The bypass diode layers are deposited over the lateral conduction layer. In one portion of the substrate, the bypass diode layers are removed, leaving the exposed solar cell layers. In the other portion, the layers to be used in forming the bypass diode are allowed to remain. A trough is etched, electrically separating the solar cell region from the by pass region. A metal shunt layer is deposited with one side of the shunt connected to the substrate and another side of the shunt connected to the lateral conduction layer which connects to an active layer of the bypass diode. The metal shunt acts to short the intermediate layers forming the support of the bypass diode, so that such layers do not perform any electrical function, but only act as the support of the bypass diode.

As noted above, individual solar cells are connected sequentially to form a vertical column of an array. Such series connection requires an electrical path between the cathode or top layer of one cell with the anode or bottom layer of the adjacent cell. In particular, in solar cells with an integral bypass diode, a connection must be made from both the multijunction solar cell and from the bypass diode on the top surface of a first wafer to the bottom surface of the adjoining wafer.

Prior art interconnection arrangements have utilized a single electrical contact to the top layer (or anode) of the bypass diode. Although such an arrangement is generally satisfactory for most applications and reliability requirements, there are certain applications in which more stringent reliability is required. Prior to the present invention, existing interconnection arrangements have not been able to meet such reliability requirements.

SUMMARY OF THE INVENTION

1. Objects of the Invention

It is an object of the present invention to provide an improved solar cell array.

It is another object of the invention to provide means for preventing electrical shorts arising from the interconnects between a bypass diode and a solar cell semiconductor device.

It is another object of the present invention to provide an interconnect configuration in a solar cell semiconductor device with a bypass diode for improved array reliability and higher manufacturing yields.

It is still another object of the invention to provide an improved method for manufacturing a solar cell array by utilizing a pair of multi-contact interconnects between the bypass diode and the adjacent solar cell.

Some implementations may achieve fewer than all of the foregoing objects.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

2. Features of the Invention

Briefly, and in general terms, the present invention provides a solar cell array including a first solar cell with an integral bypass diode, a second solar cell with an integral bypass diode, a first metal interconnection member coupling the cathode of the first solar cell with the anode of the second solar cell. There is further provided a second metal interconnection member coupling a first region on the anode of said bypass diode with a first region on the anode of the second solar cell; a third metal interconnection member coupling a second region on the anode of said bypass diode with a second region on the anode of the second solar cell.

The novel features which are considered as characteristic of the invention are set forth in particular in the appended claims. The invention itself, however, both as to its construction and its method of operation, together with additional objects and advantages thereof, bets will be understood from the following description of specific embodiments when read in connection with the accompanying drawings.

BRIEF DESCRIPTION OF THE DRAWINGS

These and other features and advantages of this invention will be better and more fully appreciated by reference to the following detailed description when considered in conjunction with the accompanying drawings, wherein.

DESCRIPTION OF THE PREFERRED EMBODIMENT

Figure 1B:
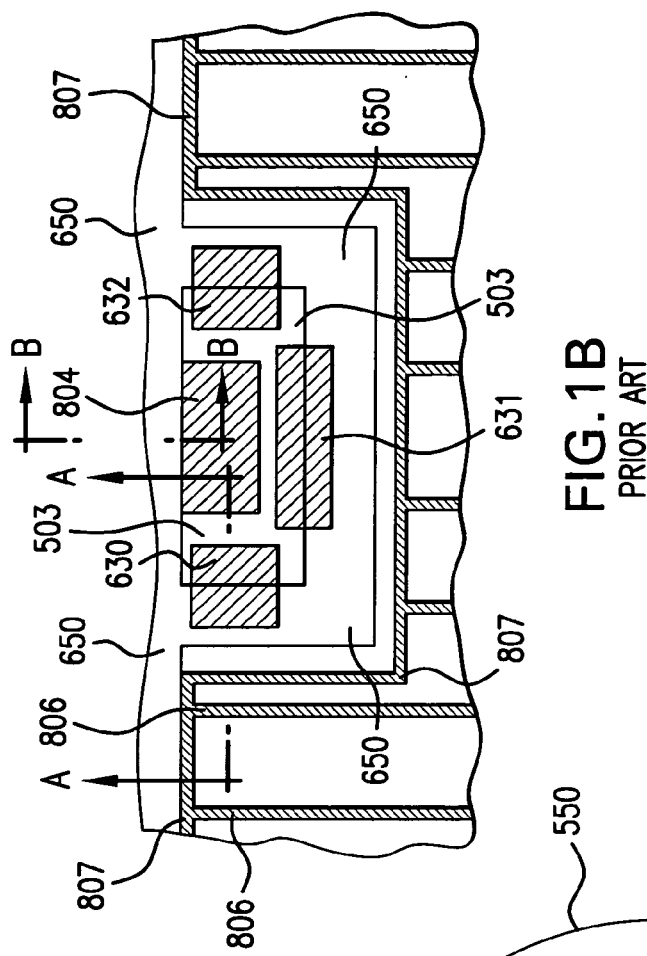
FIG. 1B is an enlarged top view of the solar cell of FIG. 1A showing the bypass diode.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present invention relates to the interconnection of the anode and cathode contacts of III-V multi-junction solar cells in an array by use of metallic clips or jumpers which are bonded or welded to the adjoining cells. Solar cell semiconductor devices, such as those depicted in U.S. Pat. No. 6,680,432, often include bypass diodes epitaxially grown on the substrate but separated from the solar cell structure by a trench that provides electrical isolation of the solar cell and the bypass diode. The surface of the trench is covered by a dielectric material of any suitable material that is nonconductive and reduces the possibility of an electrical short or shunt path being created along the edge of the cell.

Figure 1A:
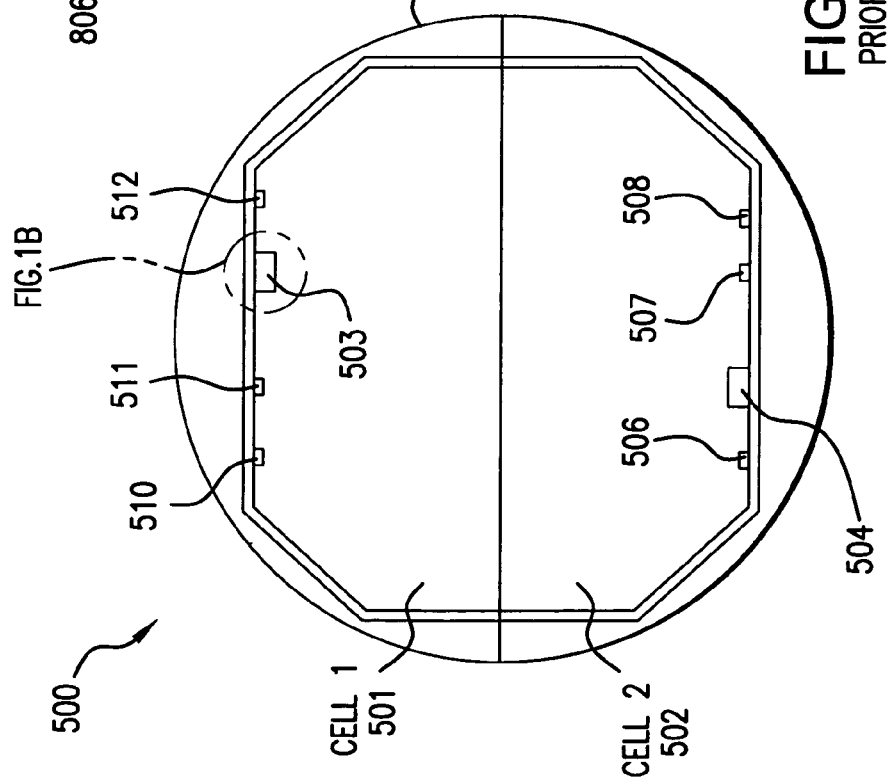
FIG. 1A is a top plan view of a semiconductor wafer with solar cell with a bypass diode as known in the prior art.

FIG. 1A is a top plan view of a semiconductor wafer with solar cell with a bypass diode as known in the prior art. A typical wafer 500 can accommodate two cells 501 and 502 which are scribed or cut out from the wafer 500 at the end of the fabrication process. The peripheral edge material 550 of the semiconductor wafer is discarded. Electrical contacts 510, 511 and 512 to the top surface or cathode of the cell 501 are depicted, as well as the electrical contacts 506, 507 and 508 of cell 502. The bypass diode 503 of cell 501, and the bypass diode 504 of cell 502 are also depicted, and are shown in greater detail in the enlarged portion of the wafer shown as in FIG. 1B.

FIG. 1B is an enlarged top plan view of the region of the wafer with bypass diode 503 implemented in the solar cell of FIG. 1A. the Figure also shows some of the vertical conductors 806 which extend in parallel over the top surface of the cell 501 and function to make electrical contact with the top layer of the cell 501 and collect charge when the surface is illuminated. There is also depicted an electrically conducting bus 807 which extends around the periphery of the cell 501 and functions to electrically connect each of the conductors 806, and also to connect to the cathode electrical contacts 510, 511, and 512 on the top surface of the cell 501, which are depicted in FIG. 1A.

Figure 2:
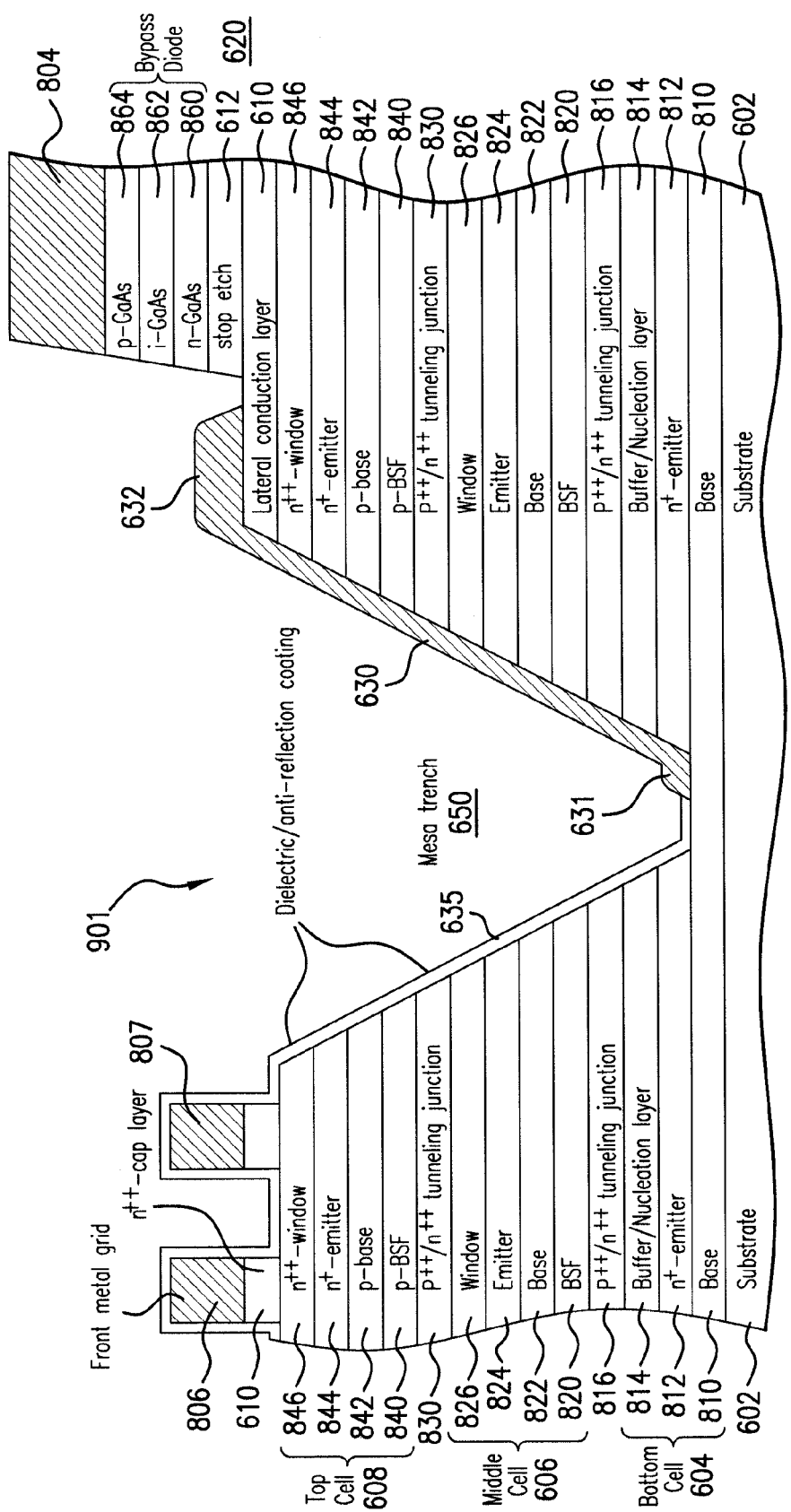
FIG. 2 is an enlarged cross-sectional view of the solar cell with a bypass diode through the A-A plane of FIG. 1B.
Figure 3:
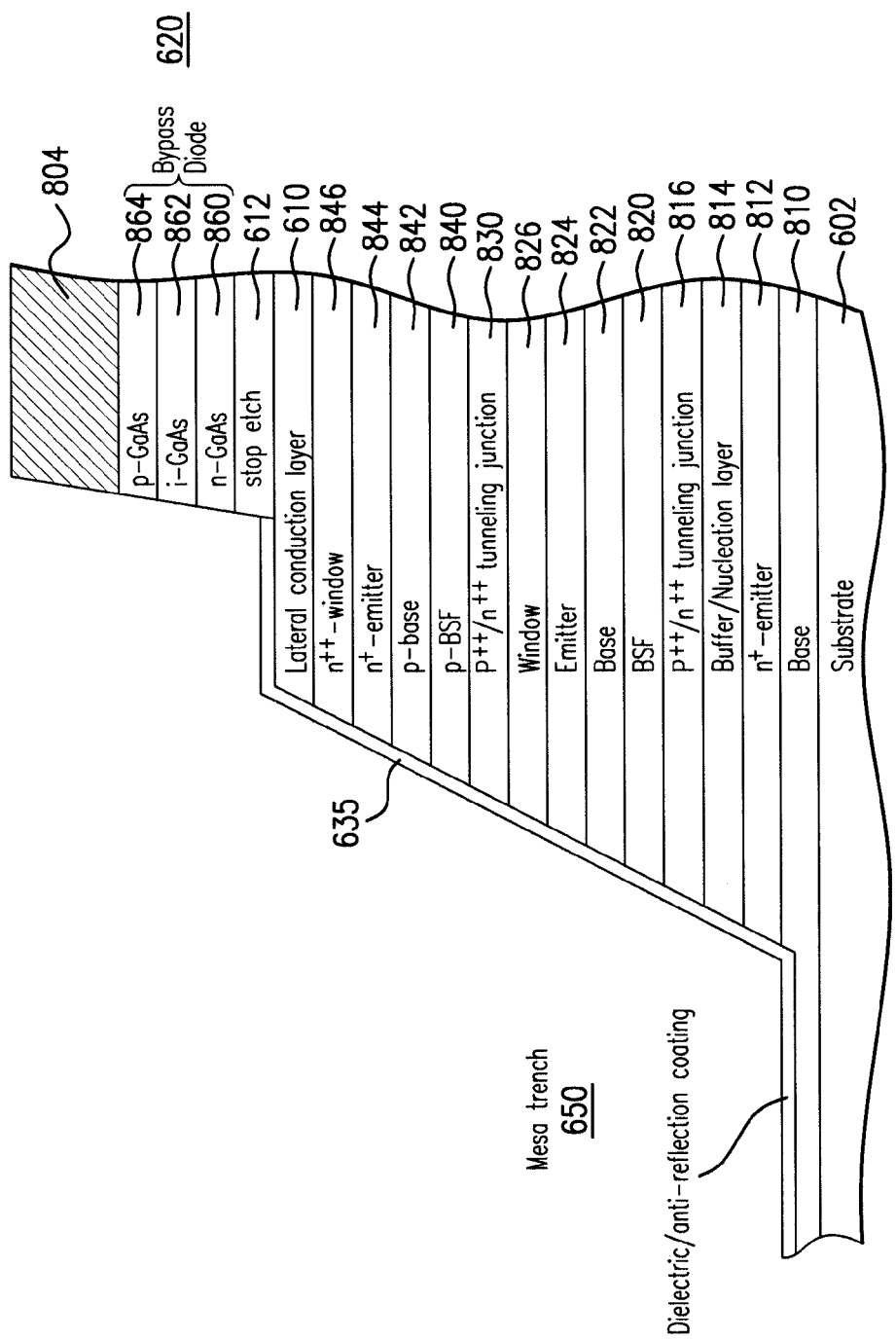
FIG. 3 is an enlarged cross-sectional view of the solar cell with a bypass diode through the B-B plane of FIG. 1B.

The top plan view of the bypass diode 503 shows that it is preferably rectangular in shape, and as will be seen in the cross-sectional views of FIGS. 2 and 3, is also preferably implemented as a mesa structure fabricated over the top layer of the cell 501. Three spaced apart metal layers 630, 631 and 632 extend over three sides of the mesa and function to make electrical contact between the top layer of the bypass diode 503 and the substrate located at the bottom of the trench 650. Another metal layer 804 is also deposited on the top of the bypass diode 503 which functions as the electrical contact to the top terminal of the diode, which in the preferred embodiment is the anode of the diode.

FIG. 2 illustrates a detailed cross-sectional view of an integral semiconductor structure with a triple junction solar cell structure 640 and a bypass diode 503 through the A-A plane of FIG. 1B. The structure includes a substrate 602, a triple junction solar cell 640, a bypass diode 620, a trench or well 650, and an electrical shunt layer 630. The triple junction solar cell structure 640 further includes a bottom, middle, and top subcells 604, 606, and 608 respectively. One of the conductive grid lines 806, and is depicted as deposited over a lateral conduction layer 610. The contact pad 804 is also depicted as deposited over the bypass diode 620.

FIG. 3 illustrates a cross-sectional view of the cell 501 through the B-B plane of FIG. 1B, depicting a layer of non-conduction or dielectric material 635 that surrounds the edges of the cell 501 to prevent the possibility of an electrical short or shunt path being created along the edge of the cell. In the preferred structure according to the present invention, the same material that is normally used as an antireflection coating (ARC) over the surface of the cell 501 is an ideal choice for this dielectric material 635. The ARC layer is normally applied to the top surface of the solar cell 501 in current commercial devices to reduce front surface reflection. The preferred embodiment uses a fabrication sequence of steps that allows the ARC layer to extend not only over the surface of the solar cell, but into the mesa trench 650 to provide the protection of the vertical edge of the solar cell mesa.

In greater particularity, in one embodiment, the substrate is a p-type germanium ("Ge") substrate 602 which is entirely covered with a metallic layer 514 on the backside of the semiconductor wafer 500 to form a lower metal contact pad (as shown in FIG. 4). The bottom cell 604 contains a p-type Ge base layer 810, an n-type Ge emitter layer 812, and an n-type GaAs layer 814. The base layer 810 is formed in the substrate 602 by techniques known in the art. The layer 810 in one embodiment can be formed through diffusion of atoms into the Ge substrate from a deposited emitter layer 812. After the bottom cell 604 is fabricated, a sequence of p-type and n-type tunneling junction layers 816, are deposited to form a structure sometimes referred to as a tunneling diode that provides a circuit element to connect the bottom cell 604 with the next subcell 606.

The middle cell 606 further includes a back surface field ("BSF") layer 820, a p-type GaAs base layer 822, an n-type GaAs emitter layer 824, and an n-type gallium indium phosphide$_2$ (GaInP$_2$) window layer 826. The base layer 822 is deposited over the BSF layer 820 once the BSF layer 820 is deposited over the tunneling junction layers 816. The window layer 826 is subsequently deposited on the emitter layer 824 after the emitter layer 824 is deposited on the base layer 822. The BSF layer 820 is used to reduce the recombination loss in the middle cell 606. The BSF layer 820 drives minority carriers from a highly doped region near the back surface to minimize the effect of recombination loss. In other words, a BSF layer 820 reduces recombination loss at the backside of the solar cell thereby reduces the recombination at the base region.

The window layer 826 used in the middle cell 606 also operates to reduce the recombination loss. The window layer 826 also improves the passivation of the cell surface of the underlying junctions. It should be apparent to one skilled in the art, that additional layer(s) may be added or deleted in the cell structure without departing from the scope of the present invention. Before depositing the layers of the top cell 608, p-type and n-type tunneling junction layers 830 are deposited over the middle cell 606 to form a tunnel diode connecting the middle cell 606 to the top cell 608.

The top cell 608, according to this embodiment, includes layer sequence of a p-type indium gallium aluminum phosphide$_2$ ("InGaAlP$_2$") BSF layer 840, a p-type GaInAP$_2$ base layer 842, and n-type GaInAP$_2$ emitter layer 844, and an n-type aluminum indium phosphide$_2$ ("AlInP$_2$") window layer 846. The base layer 842 of the top cell 608 is deposited on the BSF layer 840 once the BSF layer 840 is deposited over the tunneling junction layers 830. The window layer 846 is subsequently deposited on the emitter layer 844 after the layer 844 is deposited on the base layer 842.

According to this embodiment, an n-type GaAs cap layer 850 is employed for enhancing better contact with metal materials. A cap layer 610 is deposited over the top cell 608. The cap or lateral conduction layer 610 is formed of n-type GaAs, is deposited over the window layer 846. An n-type GaInP$_2$ stop etch layer 612 is deposited over the lateral conduction layer 610. After the stop etch layer 612 is deposited, the layers that will form the bypass diode on one portion of the cell 501 are epitaxially deposited over the entire wafer.

The bypass diode layers 620 include in one embodiment, a sequence of an n-type GaAs layer 860, an i-type GaAs layer 862 layer, and a p-type GaAs layer 864. The n-type layer 860 is deposited over the stop etch layer 612. The i-type layer 862 is deposited over the n-type layer 860. The p-type layer 864 is deposited over the i-type layer 862. After layer 864 is deposited, a contact pad 804 is deposited over the bypass diode 620. Once the anode contact pad 804 is formed, the result is that an integral p-i-n bypass diode with p-on-n polarity is formed over the solar cell. In another embodiment, an n-i-p bypass diode with n-on-p polarity can be formed over solar cell structure using similar process described above. It should be apparent to one skilled in the art that additional layer(s) may be added or deleted in the bypass diode 620 without departing from the scope of the present invention.

In one embodiment, a metal shunt layer 630 is deposited into a portion of the well 650. One end 631 of the shunt 630 makes electrical contact with the substrate 602 and the other end 632 of the shunt 630 makes electrical contact with the lateral conduction layer 610, and thereby to an active layer 846 of the triple junction cell (more specifically, to the top cell 608). An antireflection coating 635 may be deposited over certain parts of the solar cell to enhance solar cell performance.

It should be noted that the multijunction solar cell structure could be formed by any suitable combination of group III to V elements listed in the periodic table, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

Figure 4A:
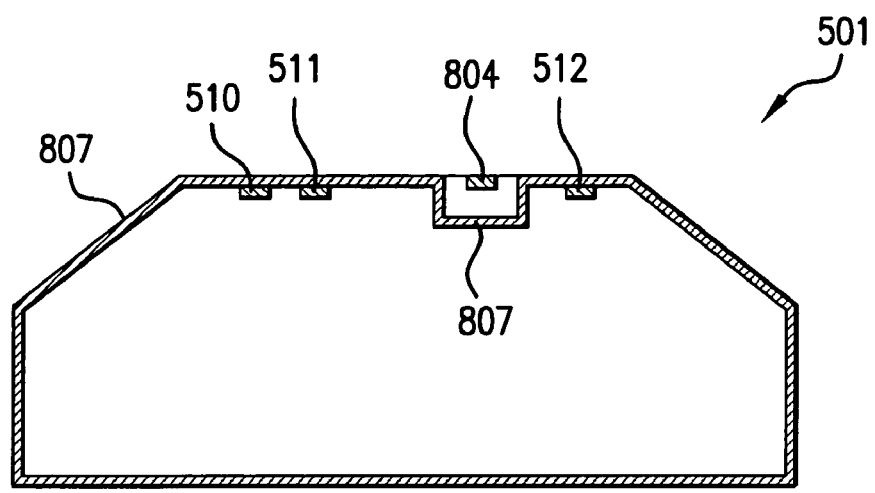
FIG. 4A is a top plan view of the solar cell with a bypass diode as cut from the wafer depicted in FIG. 1A.

FIG. 4A is a top plan view of the solar cell 501 after it has been scribed or cut from the wafer 500. In particular, there is illustrated the peripheral bus 807, the contacts 510, 511 and 512, and the bypass diode contact 804.

Figure 4B:
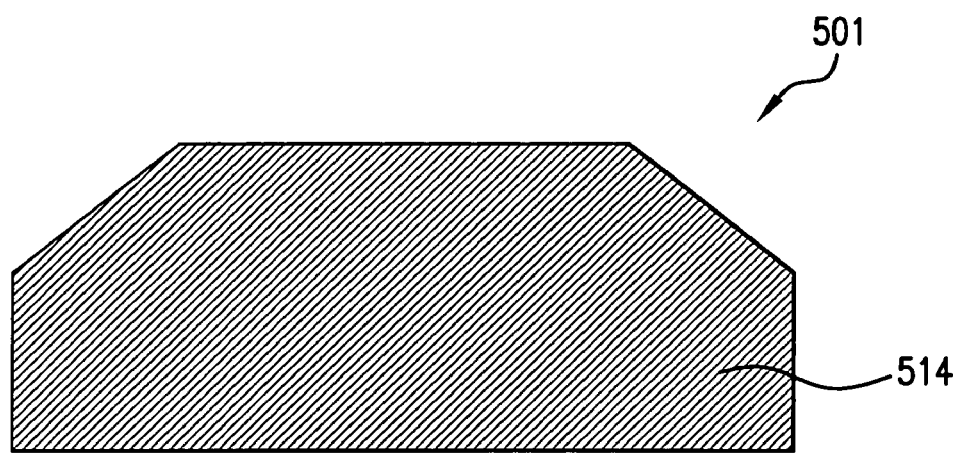
FIG. 4B is a bottom plan view of the solar cell with a bypass diode shown in FIG. 4A.

FIG. 4B is a bottom plan view of the solar cell 501, and in particular illustrating the backside contact metallic layer 514.

Figure 5:
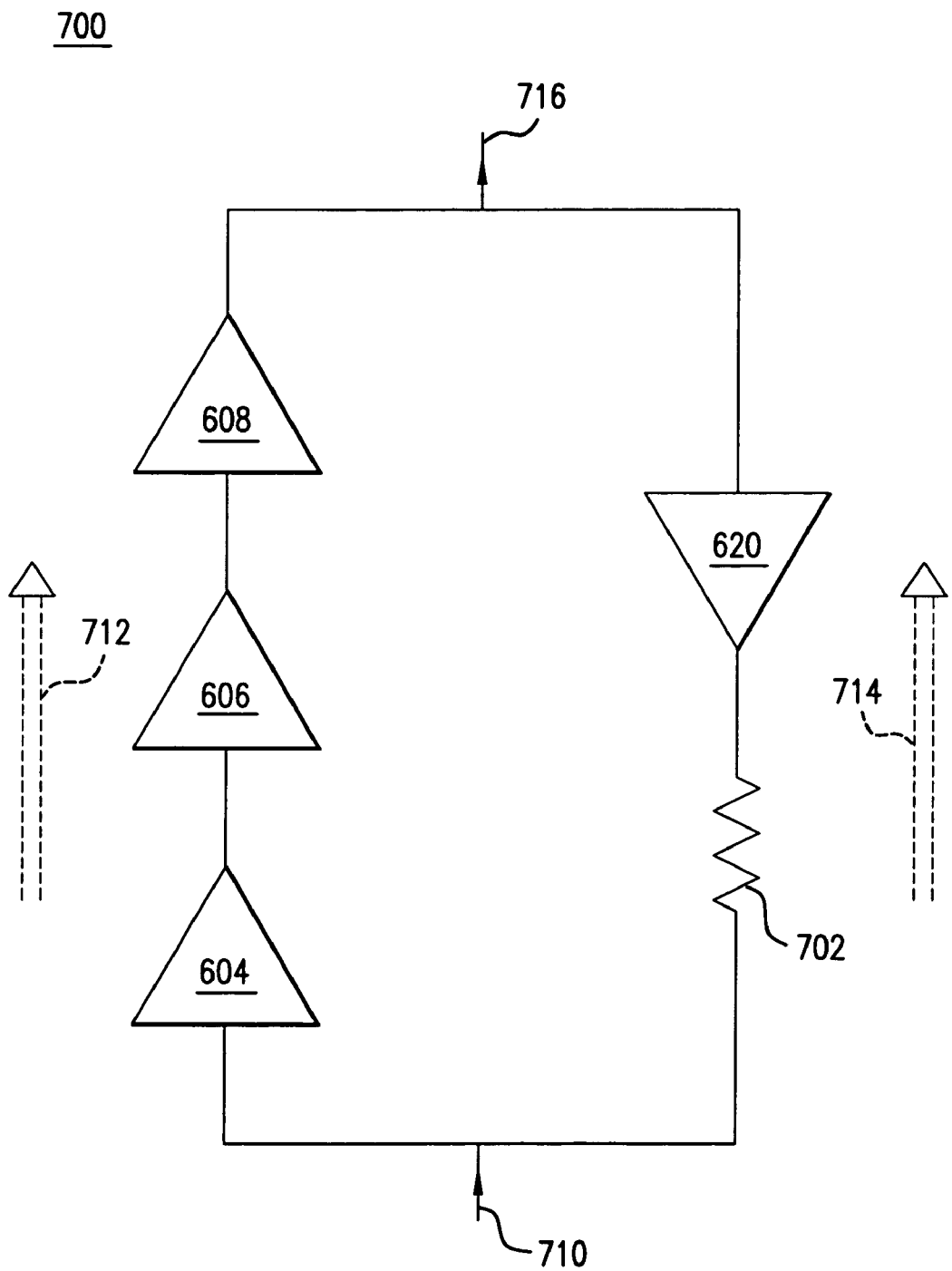
FIG. 5 is a circuit diagram of the solar cell with a bypass diode of FIG. 4A.

FIG. 5 is a circuit diagram 700 illustrating the electrical circuit represented by the solar cell 501, including the triple junction solar cell structure and the bypass diode 620. The circuit 700 depicts the top cell 608, the middle cell 606, the bottom cell 604, the bypass diode 620, a resistance block 702, and four paths 710, 712, 714, and 716. In one embodiment, the resistance block 702 represents the electrical resistance from the shorted portion of the multijunction solar cell structure that is disposed underneath of the bypass diode 620 and the resistance from the shunt 630 shown in FIG. 2.

During normal operation space (e.g., when solar cells 604-608 are exposed to sunlight, solar light, light, radiation, and/or photons), the solar cells 604-608 are forward biased. They convert solar energy to electrical energy and the generated electric current between the adjacent neighboring solar cells connected in series. It should be noted that the terms sunlight, solar light, light, radiation, and/or photons may be used interchangeable herein. In this embodiment, solar cells are connected in a series. While solar cells 604-608 are forward biased, bypass diode 620 is reverse biased because bypass diode 620 has an opposite polarity from solar cells. Thus, when bypass diode 620 is in reverse bias mode, no electric current passes through the bypass diode 620, and the solar cells 604-608.

When electrical current generated from the neighboring solar cells arrives at solar cells 604-608 via path or contact 710, solar cells 604-608 pass an aggregate total electrical current, which includes the current converted by light striking solar cells 604-608 and the input current arriving from neighboring solar cells through path 710, to path 716 via path 712. Path or contact 716 may be connected to another solar cell (such as solar cell 521 depicted in FIG. 6) and/or other electrical devices.

However, during the situation in which the solar cells 604-608 are in reverse bias mode when, for example, solar cells 604-608 are shadowed, the bypass diode 620 becomes forward biased. In this situation, bypass diode 620 becomes an active device and passes the current from neighboring solar cells via path 710 to path 716 through path 714. In other words, when the solar cells 604-608 are in reverse bias mode, the bypass diode 620 becomes forward biased and path 714 is used to pass the current from path 710 to path 716. Thus, in this circuit configuration, bypass diode protects the cells 604-608.

Figure 6:
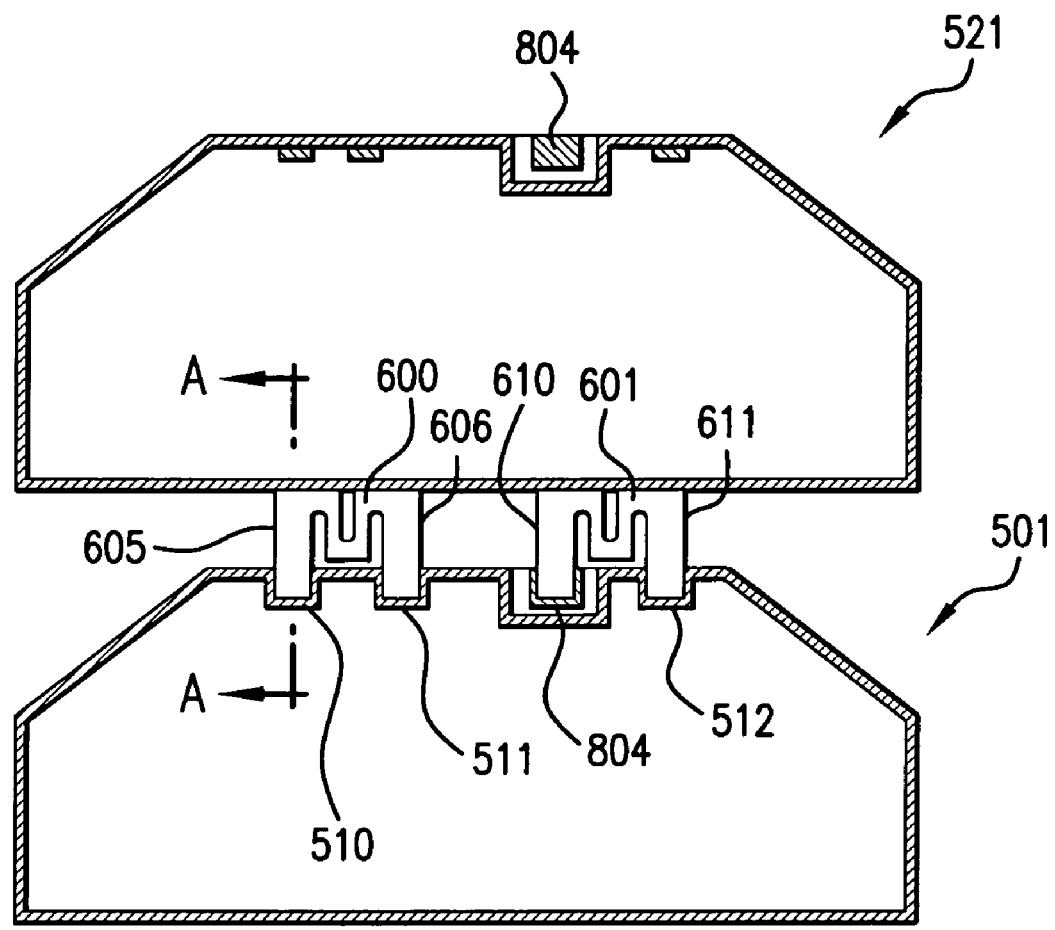
FIG. 6 is a top plan view of a sequence of two solar cells connected in an array using a cathode to anode interconnect between cells as known in the prior art.

Turning now more particularly to the features of the present invention, FIG. 6 is a top plan view of a portion of an array utilizing a solar cell with an integral bypass diode depicting the interconnection members to the adjacent solar cell 521 as currently known in the art. In particular, there is depicted a left interconnection member 600 with first and second elongated contact members 605 and 606 which make contact with pads 510 and 511 respectively on the top surface of the solar cell 501. The advantage of using two separate contact members and two pads respectively is to achieve improved reliability in the event one of the electrical contacts is broken or otherwise shorts. On the right hand side of the cell 501, there is depicted a right interconnection member 601 with first and second elongated contact members 610, 611 respectively. The first contact member 610 makes contact with the anode contact 804 of the bypass diode, and the second contact member 611 makes contact with pad 512 on the top surface of the solar cell 501 which in turn is electrically connected to the grid lines 806 and 807 located on the top surface. Note in particular that there is only a single electrical contact to the contact 804 of the bypass diode.

Figure 7:
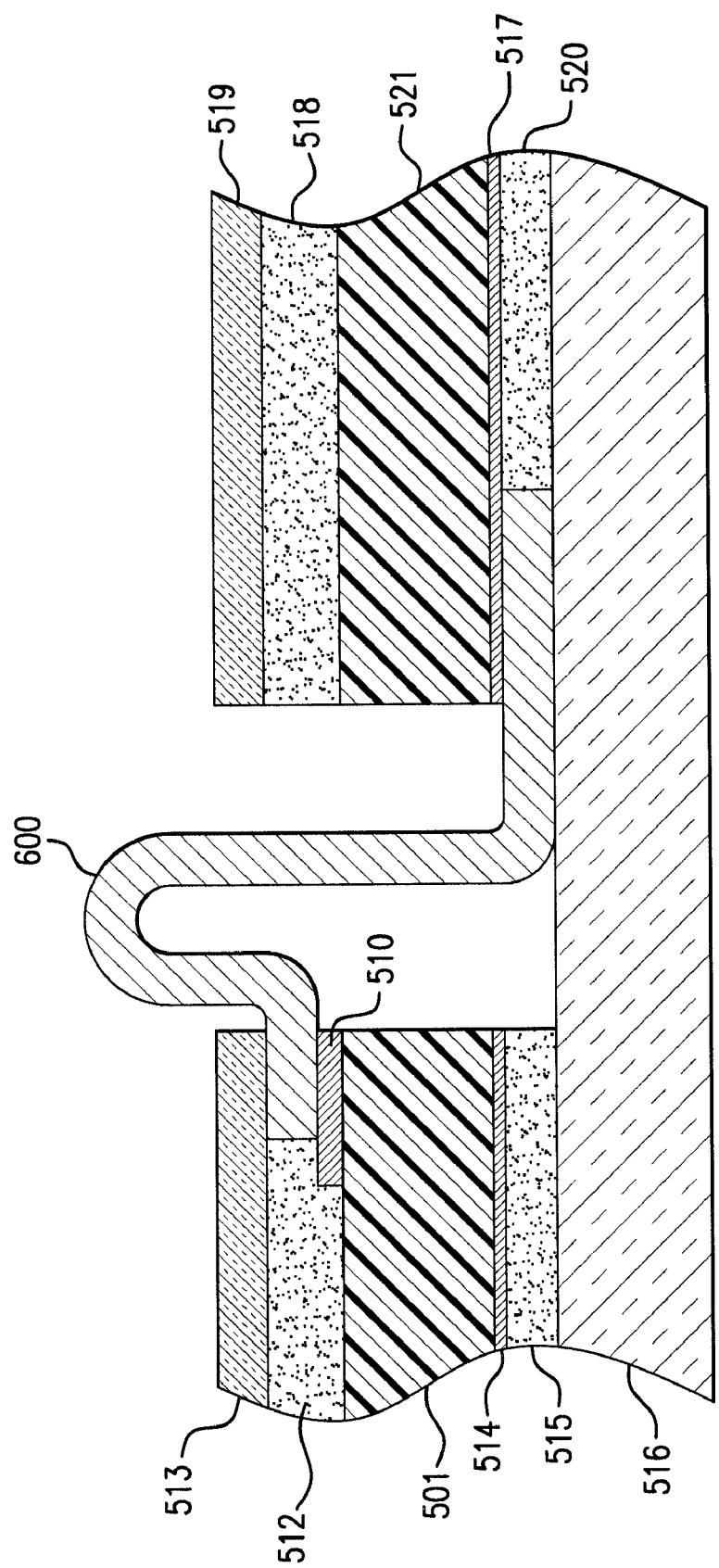
FIG. 7 is a cross-sectional view of the two solar cells through the A-A plane of FIG. 6'

FIG. 7 is a cross-sectional view of the array portion with two connected solar cells through the A-A plane of FIG. 6. In particular, there is depicted a lower glass substrate 516 for supporting the cells 501, 521, etc. forming the array. The bottom or backside of cell 501 has a metallic contact layer 514, as depicted in FIG. 4B covering the entire surface, and similarly the backside of cell 521 has a metallic contact layer 517. The interconnection member 600 makes electrical contact with the pad 510 on the cell 501, and the contact layer 517 of cell 521. An adhesive layer 515 secures the cell 501 to the glass substrate 516, and adhesive layer 520 secures the cell 521 to the substrate 516.

The top surface of the cell 501 is covered by a protective glass cover 513 which is transparent when exposed to an AMO space radiation environment (the spectrum found in orbit outside of the earth's atmosphere). The cover 513 is typically a ceria doped borosilicate glass nominally 100 microns in thickness. The cover 513 is attached to the cell 501 by a suitable transparent silicone adhesive layer 512, nominally 50 microns in thickness. Similarly, the top surface of cell 521 is covered by the glass cover 519, secured by adhesive layer 518.

Figure 8:
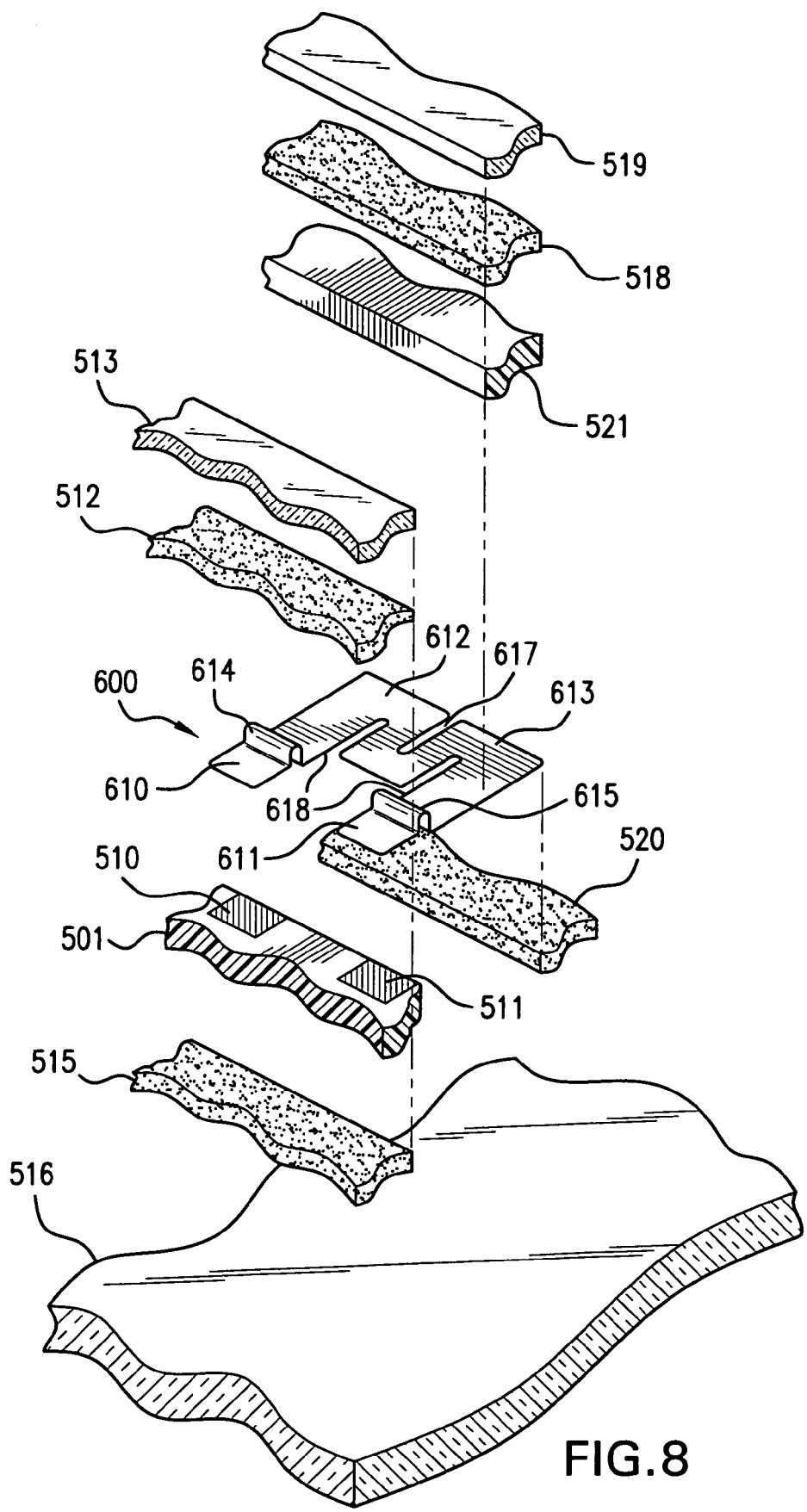
FIG. 8 is an exploded view of a portion of the sequence of two solar cells with an interconnect as depicted in FIG. 6A or jumpers according to the prior art.

FIG. 8 is an exploded view of a portion of the sequence of two solar cells with an interconnect member 600 as depicted in FIG. 6A. There is depicted the glass substrate 516, the adhesive layer 515, and a portion of the solar cell 501 with pads 510 and 511 on the upper surface. The interconnect member 600 is typically composed of a silver plated Invar alloy forming a strip about 50 microns in thickness with a first end 610 making electrical contact with the pad 510. Contact is preferably made by welding, but other interconnect technologies such as mechanically bonding, crimping, or soldering are within the scope of the present invention.

The interconnect member 600 is preferably serpentine shaped, with middle portions 612 and 613 making electrical contact with the metal contact layer 517 at the backside of cell 521 (as depicted in FIG. 7). The second end 611 of member 600 makes electrical contact with pad 511 of cell 501. The member 600 also has a number of gaps 617, 618 where the planar surface changes direction, for stress relief.

The cover 513 and adhesive layer 512 over cell 501, and the cover 519 and adhesive layer 518 over cell 521, are also depicted.

Figure 9:
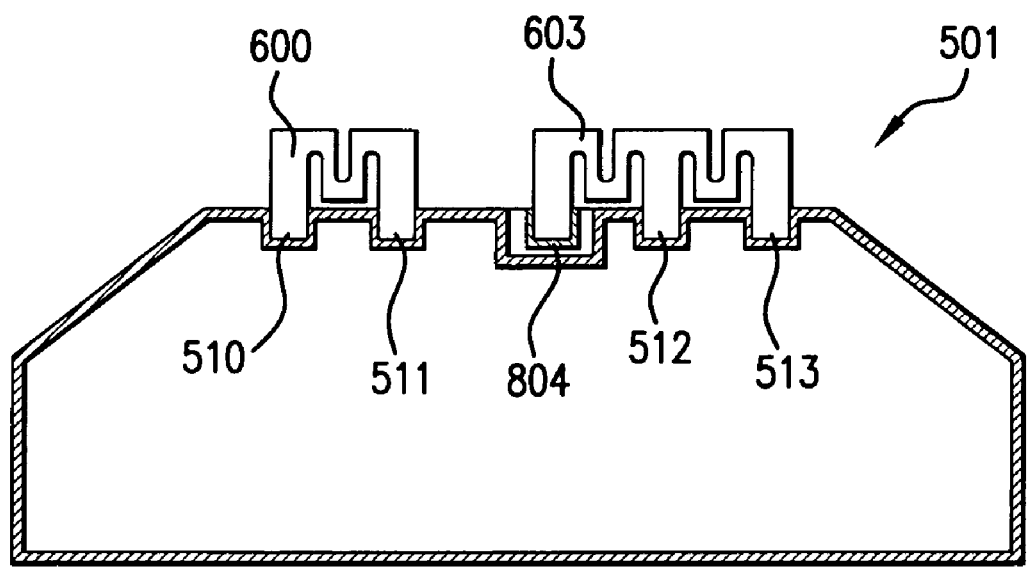
FIG. 9 is a top plan view of a solar cell with a bypass diode with another pair of interconnects attached to the cell according to the prior art.

FIG. 9 is a top plan view of a solar cell with a bypass diode with another type of interconnection member attached to the cell also known in the prior art. The interconnection member 600 on the left side of the cell 501 is the same as discussed above in connection with FIGS. 6-8. The interconnection member 603 on the right hand side of the cell 501 is an example of a "three toe" member, with three portions making respective contact with bypass diode 804 and pads 512 and 513 on the right side of the cell 501.

Figure 10:
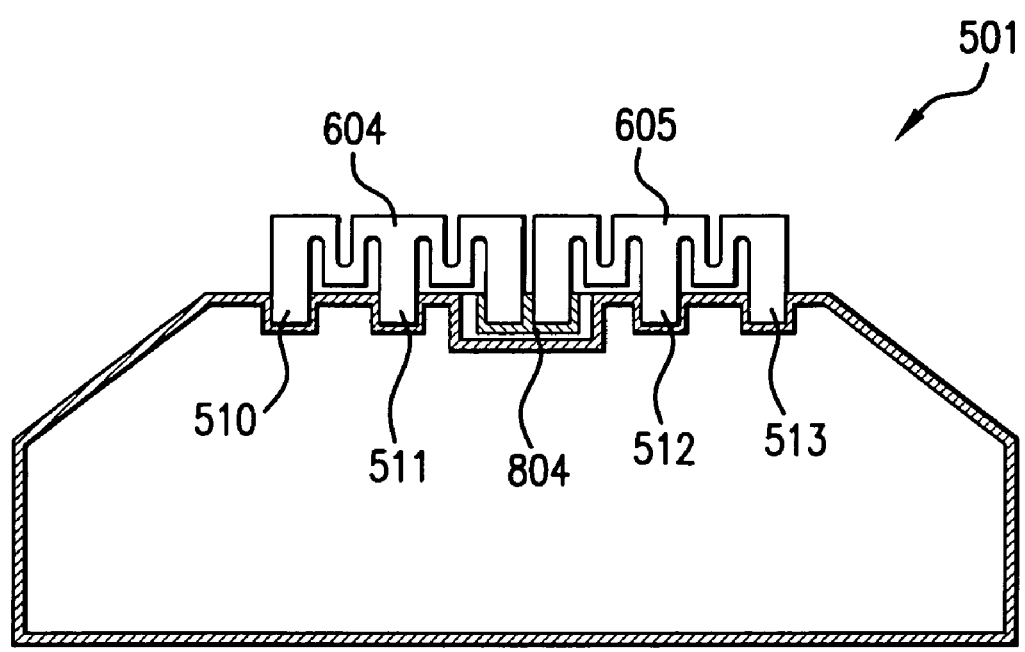
FIG. 10 is a top plan view of a solar cell with a bypass diode with a pair of interconnects to the bypass diode according to the present invention.

FIG. 10 is a top plan view of a solar cell with a bypass diode with a pair of interconnects to the bypass diode according to the present invention.

The interconnection member 605 on the right side of the cell 501 is the same as member 603 above in connection with FIG. 9 with portions making contact with the bypass diode 804 and pads 512 and 513 on the right side of the cell 501. The interconnection member 604 on the left hand side of the cell 501 is also a "three toe" member, with portions making contact with bypass diode 804 and pads 510 and 511 on the left side of the cell 501.

As depicted in FIG. 10, the present invention provides for redundancy in the electrical connection between the first and second solar cells 501, 521. The two separate interconnection members 604, 605 provide multiple different connections between the cathode of the first solar cell 501 and the anode of the second solar cell 521. Additionally, the members 604, 605 provide two separate connections between the anode of the bypass diode 804 of the first solar cell 501 and the anode of the second solar cell 521. Further, the connections are spread over different regions of the solar cells 501, 521. Overall failure of this electrical interconnection between the solar cells 501, 521 would require failure of each of the multiple cathode-anode connections and failure of each of the anode-anode connections. The various prior art designs cited in this application do not provide for this amount of redundancy.

The embodiment of FIG. 10 specifically includes two interconnections members 604, 605 each with a three toe configuration with three contact members. Interconnection member 604 includes two elongated contact members that connect the pads 510, 511 of the cathode of the first solar cell with the anode of the second solar cell. Interconnection member 604 includes an additional elongated contact member that connects a first anode region of the bypass diode 804 with the anode of the second solar cell 521. Likewise, interconnection member includes two elongated contact members that connects pads 512, 513 of the cathode of the first solar cell with the anode of the second solar cell, and one contact member that connects a second anode region of the bypass diode 804 with the anode of the second solar cell 521. Failure of this overall connection would require failure of each of the four cathode-anode connections between the solar cells 501, 521 and failure of the two connections between the anode of the bypass diode 804 of the first solar cell and the anode of the second solar cell 521.

Figure 11:
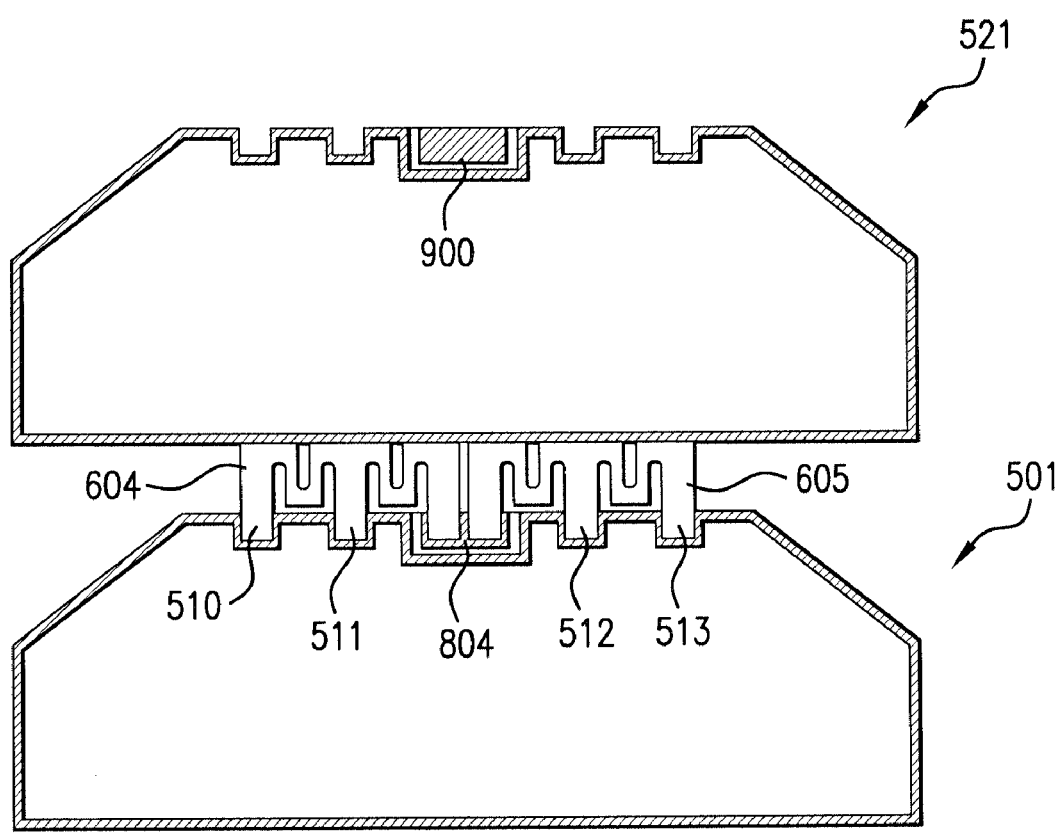
FIG. 11 is a top plan view of first and second solar cells each with a bypass diode.

FIG. 11 illustrates interconnection members 604, 605 that couple the first solar cell 501 to the second solar cell 521. The first solar cell 501 includes an integral bypass diode 804, and the second solar cell 521 includes an integral bypass diode 900.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit scope of the invention.

It will be understood that each of the elements described above, or two or more together, also may find a useful application in other types of constructions differing from the types described above.

While the invention has been illustrated and described as embodied in a solar cell array, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapted it for various applications without omitting features that, from the standpoint of prior art, fairly constitute essential characteristics of the generic or specific aspects of this invention and, therefore, such adaptions should and are intended to be comprehended within the means and range of equivalence of the following claims.

What is claimed is:

1. A solar cell array including a first solar cell with an integral first bypass diode, a second solar cell with an integral second bypass diode, a first metal interconnection member coupling the cathode of the first solar cell with the anode of the second solar cell and coupling a first region on the anode of said first bypass diode with a first region on the anode of the second solar cell; and
   a second metal interconnection member coupling a second region on the anode of said first bypass diode with a second region on the anode of the second solar cell.

2. An array as defined in claim 1, wherein the first solar cell comprises a semiconductor body having a sequence of layers of semiconductor material including a first region in which the sequence of layers of semiconductor material forms at least one cell of a multijunction solar cell; and a second region in which the sequence of layers forms said first bypass diode so that when the solar cell is forward biased, the first bypass diode is reverse biased, and when the solar cell is reverse biased, the first bypass diode is forward biased.

3. An array as defined in claim 1, wherein the first solar cell comprises a semiconductor body having a sequence of layers of semiconductor material including:
   a first region in which the sequence of layers of semiconductor material forms a sequence of cells of a multijunction solar cell; and
   a second region separated from said first region by a trough in said sequence of layers and in which the sequence of layers forms a support for said first bypass diode to protect the multijunction solar cell against reverse biasing by allowing current to pass when the first solar cell is shadowed.

4. An array as defined in claim 3, wherein the first solar cell further comprises a passivation layer extending into said trough over the edge of said sequence of layers of said first region.

5. An array as defined in claim 2, wherein the sequence of layers said one cell and the sequence of layers of the first bypass diode are epitaxially grown in a different process step.

6. An array as defined in claim 2, wherein the semiconductor body includes a Ge substrate, and at least one of the cells is fabricated at least in part with GaAs.

7. An array as defined in claim 1, wherein said first metal interconnection member is a metallic clip extending between the top surface of the anode of the first bypass diode on said first solar cell and the bottom surface of the second solar cell.

8. An array as defined in claim 7, wherein said metallic clip has a planar first end, a middle portion, and a planar second end.

9. An array as defined in claim 8, wherein said planar first end of said first interconnection member makes an electrical connection with a first portion of said anode of said first bypass diode.

10. A solar cell array comprising:
    a first solar cell with an integral bypass diode, and
    a second solar cell including
    a first metal interconnection member coupling a first region on an anode of said bypass diode with a first region on the anode of the second solar cell; and
    a second metal interconnection member coupling a second region on the anode of said bypass diode with a second region on the anode of the second solar cell and inserted and coupling the cathode of the first solar cell and the anode of the second solar cell.

11. An array as defined in claim 10, wherein said first metal interconnection member is serpentine in shape, and has a first end portion connected to said first solar cell, a second end portion connected to said first region on the anode of said bypass diode, and a middle portion connected to said second solar cell.

12. An array as defined in claim 11, wherein said second metal interconnection member is serpentine in shape, and has a first end portion connected to said first solar cell, a second end portion connected to said second region on the anode of said bypass diode, and a middle portion connected to said second solar cell.

13. An array as defined in claim 10, wherein the first and second metal interconnection members include the same shape.

14. An array as defined in claim 13, wherein the first and second metal interconnection members include three elongated electrical contact members that are separated by gaps.

15. An array as defined in claim 10, wherein the first solar cell includes a plurality of electrical contact pads positioned on a top surface that are each in contact with one of the first and second metal interconnection members.

16. An array as defined in claim 10, wherein the bypass diode includes an electrical contact pad positioned on a top surface of the first solar cell, the electrical contact pad comprising the first and second regions of the bypass diode to couple with the first and second interconnection members.

17. An array as defined in claim 10, wherein the first and second interconnection members each include planar first and second sections and an intermediate section, the intermediate sections each include a bend with opposing arms that are substantially parallel.

18. An array as defined in claim 10, wherein said first and second metal interconnection members are each a metallic clip extending between a top surface of the anode of the bypass diode on said first solar cell and the anode of the second solar cell.

19. An array as defined in claim 18, wherein the first and second interconnection members each include first and second ends positioned at different vertical levels.

20. An array as defined in claim 10, wherein the first interconnection member connects the anode of the bypass diode with the cathode of the first solar cell at multiple contact points.

* * * * *